US008779867B2

(12) United States Patent
Thaller et al.

(10) Patent No.: US 8,779,867 B2
(45) Date of Patent: Jul. 15, 2014

(54) SPLIT VARACTOR ARRAY WITH IMPROVED MATCHING AND VARACTOR SWITCHING SCHEME

(75) Inventors: Edwin Thaller, Faak am See (AT); Roberto Nonis, Villach/Warmbad (AT)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/281,871

(22) Filed: Oct. 26, 2011

(65) Prior Publication Data

US 2013/0107978 A1 May 2, 2013

(51) Int. Cl.
*H03B 5/12* (2006.01)
(52) U.S. Cl.
CPC .............. *H03B 5/124* (2013.01); *H03B 5/1265* (2013.01); *H03B 5/1212* (2013.01); *H03B 2201/0208* (2013.01); *H03B 2201/0283* (2013.01)
USPC .................. 331/177 V; 331/36 C; 331/117 FE
(58) Field of Classification Search
CPC ................. H03B 2200/005; H03B 2201/0266; H03B 2207/50
USPC ............ 331/117 R, 117 FE, 167, 177 R, 179, 331/36 C, 117 V; 334/15
See application file for complete search history.

(56) References Cited

U.S. PATENT DOCUMENTS

| 6,658,748 | B1 * | 12/2003 | Leipold et al. ................ 331/179 |
| 6,791,422 | B2 | 9/2004 | Staszewski et al. |
| 7,474,167 | B1 * | 1/2009 | Zhuang et al. ............ 331/177 V |
| 7,782,152 | B2 * | 8/2010 | Darabi et al. ............. 331/177 V |
| 7,978,017 | B2 * | 7/2011 | Pernia et al. .................. 331/167 |
| 2002/0033737 | A1 | 3/2002 | Staszewski et al. |
| 2003/0141936 | A1 | 7/2003 | Staszewski et al. |
| 2005/0130619 | A1 * | 6/2005 | Hanke et al. .................. 455/326 |
| 2007/0188243 | A1 | 8/2007 | Waheed et al. |
| 2009/0085681 | A1 | 4/2009 | Lin et al. |
| 2009/0322435 | A1 * | 12/2009 | Moussavi et al. ............... 331/57 |
| 2010/0001784 | A1 * | 1/2010 | Moussavi ...................... 327/512 |

OTHER PUBLICATIONS

Staszewski et al., "All-Digital PLL and Transmitter for Mobile Phones", IEEE Journal of Solid-State Circuits, vol. 40, No. 12, Dec. 2005, pp. 2469-2482.*
Harris et al., "Digital Design and Computer Architecture", ISBN-13: 9780123704979, Morgan Kaufmann, 2007, pp. 82.*
Wikipedia.org, "One-hot", retrieved via archive.org (capture data of Mar. 3, 2007), http://en.wikipedia.org/wiki/One-hot.*
Liangge Xu, et al., "A Digitally Controlled 2.4-GHz Oscillator in 65-nm CMOS", Analog Integr Circ Sig Process, 2009, 58: 35-42.

(Continued)

*Primary Examiner* — Ryan Johnson
(74) *Attorney, Agent, or Firm* — Eschweiler & Associates, LLC

(57) ABSTRACT

One embodiment of the present invention relates to a digital controlled oscillator. The oscillator includes an oscillator circuit, a varactor array, and a control circuit. The oscillator circuit receives a control word and a signal and generates an oscillator clock signal from the signal at a frequency selected by the control word. The varactor array has a first array of varactor cells having incremental capacitance values and a second array of varactor cells having equal capacitance values. The split varactor array provides a capacitance value. A control circuit is coupled to the oscillator circuit and controls the split varactor array according to the control word. The control circuit sets varactor cells of the split varactor array on or off.

21 Claims, 13 Drawing Sheets

(56) References Cited

OTHER PUBLICATIONS

Nicola Da Dalt, et al., "A 10b 10GHz Digitally Controlled LC Oscillator in 65nm CMOS" ISSCC 2006, Session 10, mm-Wave and Beyond, 10.5, IEEE International Solid-State Circuits Conference, 2006, p. 1-10.

Siraj Akhtar, et al., "Quad Band Digitally Controlled Oscillator for WCDMA Transmitter in 90nm CMOS", IEEE 2006 Custom Intergrated Circuits Conference (CICO), 2006, 129-132.

Francesco Svelto, et al., "A 1.3 GHz Low-Phase Noise Fully Tunable CMOS LC VCO", IEEE Journal on Solid State Circuits, vol. 35, No. 3, Mar. 2000, p. 356-361.

Robert Bogdan Staszewski, et al., "Digitally Controlled Oscillator (DCO)—Based Architecture for RF Frequency Synthesis in a Deep-Submicrometer CMOS Process", IEEE Transactions on Circuits and Systems: II: Analog and Digital Signal Processing, vol. 50, No. 11, Nov. 2003, p. 815-828.

Khurram Waheed, et al., "Curse of Digital Polar Transmission: Precise Delay Alignment in Amplitude and Phase Modulation Paths", IEEE, 2008, p. 3142-3145.

International Search Report dated Jul. 9, 2013 in connection with International Application No. PCT/EP2012/071276.

* cited by examiner

| DCO Generation | | 1st | 2nd |
|---|---|---|---|
| $\Delta f$ | [MHz] | ±1.5 | ±25.0 |
| $f_{RES}$ | [kHz] | 50 | 75 |
| $(f_{STEP})_{max}$ | [MHz] | 0.02 | 22 |
| $f_{MOD}$ | [MHz] | 26 | 175 |

| # Bits | Name | Coding | # Varactor cells | Size |
|---|---|---|---|---|
| 6 | MSB | thermo | 63 | 8× |
| 3 | LSB | 1-of-7 | 7 | 1×,2×,3×,4×,5×,6×,7× |
| 1 | LSB05 | binary | | 0.5× |

SPLIT VARACTOR ARRAY WITH IMPROVED MATCHING AND VARACTOR SWITCHING SCHEME

BACKGROUND OF THE INVENTION

Digital controlled oscillators (DCO) are important components of electronic devices, such as communication devices, synthesizers, and the like. DCOs generate a digitally variable clock signal at a frequency specified by digital information, such as a control word or control bits. The control word provided to the DCOs can be modified to change or alter the frequency of the output clock signal.

In communication circuits, phase locked loops (PLLs) are important components. PLLs enable synchronization between the receiver's carrier signal and the transmitted carrier signal by regulating the phase and frequency of carrier signals used within a device according to a reference signal. PLLs often utilize DCOs to generate the digital variable clock signal in an RF frequency band, which may then be provided to one or more dividers and a feedback path.

The PLL can adjust the variable clock signal to synchronize the receiver carrier signal and the transmitted carrier signal by adjusting the frequency of the variable digital clock. This PLL feedback loop synchronizes the variable clock signal CLKV with a reference clock REF (i.e., causing the frequency of the variable clock signal CLKV to 'track' the reference signal REF). The PLL adjusts the frequency of the digital variable clock signal by altering the control word provided to the DCO.

Typically, the frequency of the DCO is adjusted by altering a capacitance value input to the DCO. Varactors, also referred to as variable capacitors, are devices whose capacitance varies as a function of a voltage applied on its terminals. Varactors include varactor diodes and varactor devices implemented in CMOS. In general DCOs are comprising an array of varactors for frequency tuning. The varactors are turned on or off according to the control word thereby altering the capacitance to the DCO and the frequency.

An example of a prior art varactor configuration is shown in FIGS. 1A and 1B. FIG. 1A depicts a portion of a prior art varactor configuration. The configuration shows a single slice 110 of the varactor configuration. The slice includes four (4) unit cells 101, 102, 103 and 104. Each unit cell includes two (2) unit varactors, 101a, 101b, 102a, 102b, 103a, 103b, 104a, and 104b. Thus, unit cell 101 includes varactors 101a and 101b. Control lines are needed for each varactor. Thus, the slice shown in FIG. 1A requires control lines for the eight (8) varactors shown.

FIG. 1B depicts the slices 120 of the prior art varactor configuration. In this example, there are 64 slices, each slice having 4 unit cells, each unit cell having two varactors for a total of 512 addressable varactors. The slices can be arranged in top and bottom banks wherein the top bank includes slices #32-#63 and the bottom bank includes slices #0-#31. The varactors are addressable in a meander like scheme.

FIG. 1B shows the meander like addressing scheme in that varactors in slices #0, #1, and #2 have been turned on and varactors in slice #3 are in the process of being turned on (logical 1). The remaining slices #4-#63 are turned off (0).

Each varactor is individually addressable, thus 8 control lines for each slice are required. As a result, there are 512 control lines needed to individually address all of the varactors in this configuration. This results in a complex, power consuming logic circuit.

BRIEF DESCRIPTION OF THE DRAWINGS

FIG. 1B is a diagram depicting a prior art varactor configuration.

FIG. 3B is a table depicting design specification requirements for first and second generation Bluetooth digital controlled oscillators.

FIG. 5 is a block diagram of an example varactor configuration in accordance with an embodiment of the invention.

DETAILED DESCRIPTION OF THE INVENTION

Figures 1, 1A:
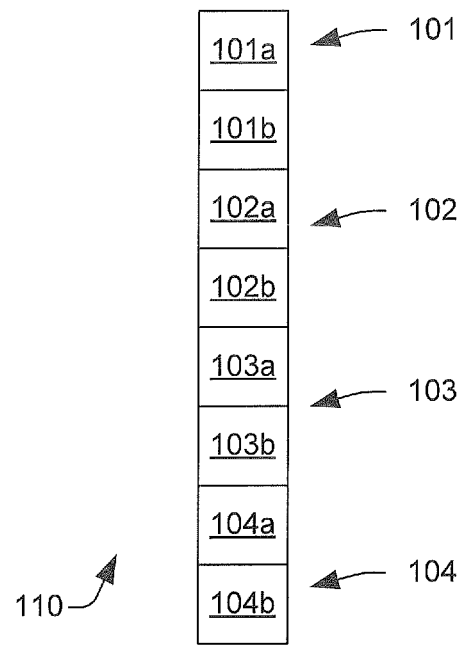
FIG. 1A is a diagram depicting a prior art varactor configuration.

One embodiment of the present invention relates to a digital controlled oscillator. The oscillator includes an oscillator circuit, a split varactor array, and a control circuit. The oscillator circuit receives a control word and a signal and generates an oscillator clock signal from the signal at a frequency selected by the control word. The varactor array has a first array of incremental sizes. The varactor array provides a capacitance value, which is utilized to adjust the frequency output of the oscillator. A control circuit is coupled to the oscillator circuit and controls the split varactor array. The control circuit sets varactor cells of the varactor array to a state of a plurality of states, such as on or off.

In another embodiment of the above, the control word includes time varying digital information. In another, the control word has a fixed number of bits. Any of the above embodiments can include that the signal is a phase component of a baseband signal. Any of the above can include that the frequency of the oscillator clock signal is configured to have a specified step size. Any of the above can also include where a lowest bit of the control word corresponds to the specified frequency step size. Any of the above can include a minimum varactor size of the first array being one and corresponding to the specified frequency step size. Any of the above, where the specified frequency step size is in the range of +/−75 kHz. Any of the above, where the specified frequency step size is in a range bigger or smaller than +/−75 kHz. Any of the above embodiments, where the first array comprises varactor cells ranging from one to a selected number, the cells having varactor sizes incrementally from one to the selected number. Any of the above, where a second array comprises a plurality of varactor cells having a varactor size of the selected number plus one. Any of the above, where the varactor array further includes a third array. Any of the above, additionally including a coupling network to couple an output of the varactor array to an output of the oscillator circuit.

In yet another embodiment, a transmitter circuit is disclosed. The circuit includes a phase lock loop circuit, an amplitude divider, a digital to analog converter, and a mixer. The phase lock loop circuit includes a digital controlled oscillator and a phase divider.

The phase lock loop circuit receives a phase component and generates a DCO clock and a phase modulated signal. The digital controlled oscillator of the phase lock loop circuit has a split varactor array comprising a first array of incremental sizes and a second array of equal sizes. The phase divider of the phase lock loop circuit divides the DCO clock into the phase modulated signal. The amplitude divider divides the DCO clock into a digital to analog clock. A digital to analog converter generates an amplitude modulated signal from an amplitude component according to the digital to analog clock. The mixer combines the amplitude modulated signal and the phase modulated signal into a combined signal. A power amp generates an output signal from the combined signal.

In another embodiment, a method of generating an oscillator signal is provided. A signal, such as a phase component of a base signal, is received. A control word designating a selected frequency is received. A split varactor array having a first array of incremental sizes and a second array of equal sizes is provided. Controlling one or more varactor cells of the split varactor array to yield a capacitance value according to the selected frequency. An oscillator clock signal is generated from the received signal at the selected frequency using the capacitance value.

The present invention will now be described with reference to the attached drawing figures, wherein like reference numerals are used to refer to like elements throughout, and wherein the illustrated structures and devices are not necessarily drawn to scale.

For digital polar transmitters, base-band modulation data is typically passed through a band limited matched pulse shaping filter and then converted to amplitude and phase modulation data using a coordinate rotation digital computer (CORDIC). The separated amplitude/phase modulation signals have a wide bandwidth. The signals are combined at a power amplifier (PA) to yield a transmitted radio frequency (RF) signal. The bandwidth of the RF signal is determined by a pulse shaping filter. FIG. 1 depicts spectral replica and filtering.

Figure 2:
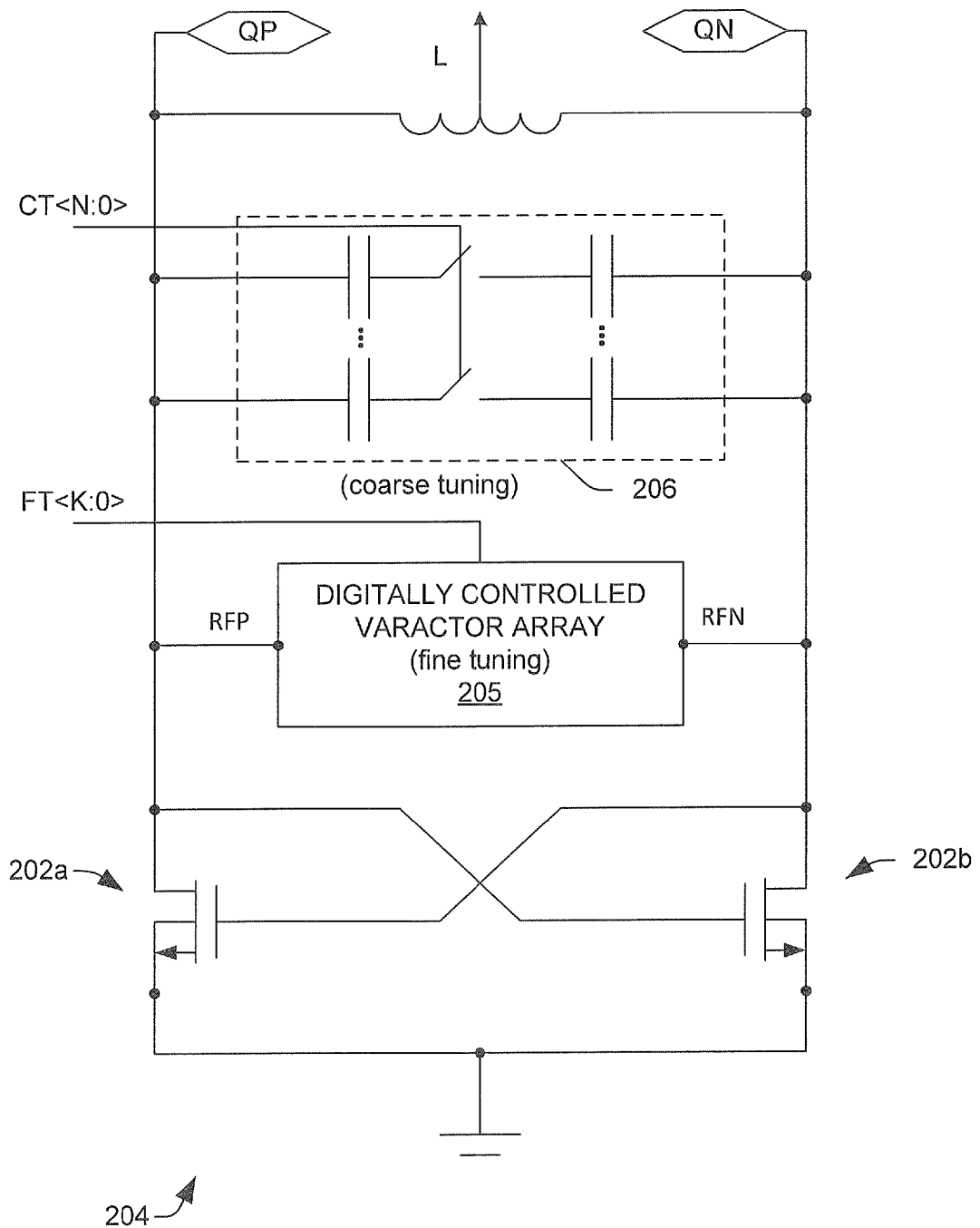
FIG. 2A is a circuit diagram illustrating a digital controlled oscillator in accordance with an embodiment of the invention.
FIG. 2B is a circuit diagram illustrating a digital controlled oscillator in accordance with an embodiment of the invention.
FIG. 2C is a circuit diagram illustrating a course tuning component in accordance with an embodiment of the invention.
FIG. 2D is a circuit diagram illustrating varactor cells implemented using CMOS technology and suitable for use with the invention.

FIG. 2A is a circuit diagram illustrating a digital controlled oscillator (DCO) 204 in accordance with an embodiment of the invention. The DCO 204 is shown in FIG. 2A for illustrative purposes and other variations and implementations are contemplated in accordance with the invention.

An output signal or clock is provided at the outputs QP and QN. An input signal or reference is provided/generated at 202. The DCO 204 includes a varactor array 205 for fine tuning and a coarse tuning component 206 for course tuning. The varactor array 205 comprises a split varactor array, such as the array 406 shown and described below and in FIG. 4. The outputs of the array 205 RFP and RFN are directly connected to the outputs QP and QN. The coarse tuning component 206 comprises a capacitor arrangement with switches. FIG. 2C provides an example arrangement of a coarse tuning component 206.

The DCO 204 generates the output clock according to control signals, also referred to as a control word. The control signals here are shown with a fine tuning component FT<K:0> and a coarse tuning component CT<N:0>. The CT component provides tuning for large or coarse frequency adjustments and the FT component provides tuning for small or fine frequency adjustments.

Figure 2B:
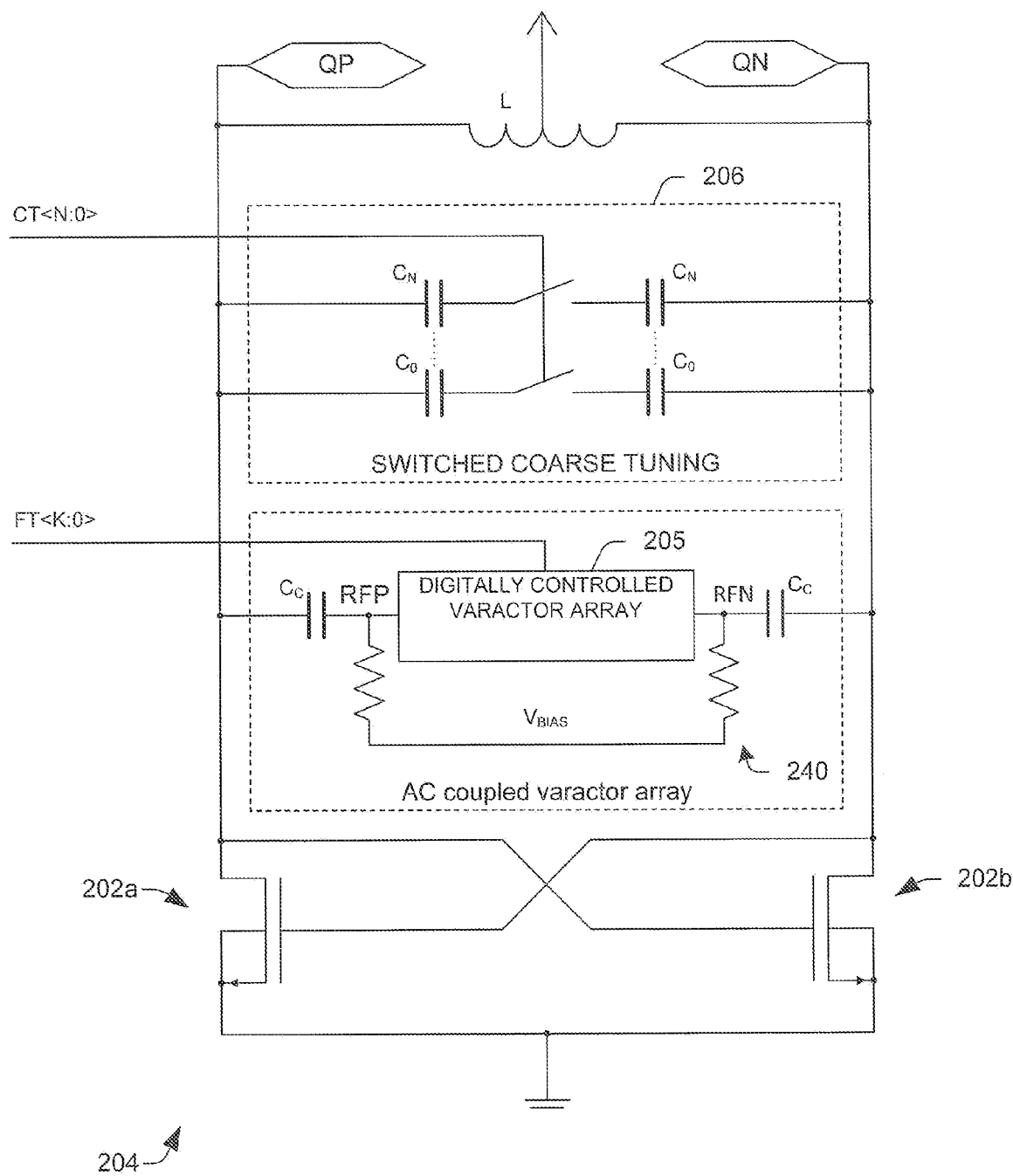
Figure 2:
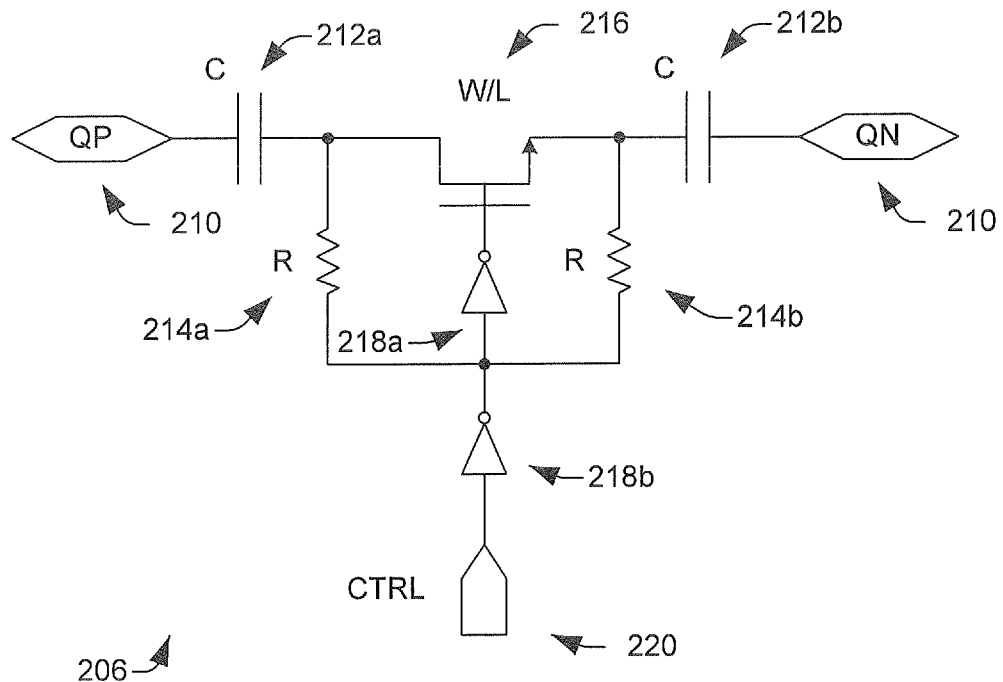
Figure 2:
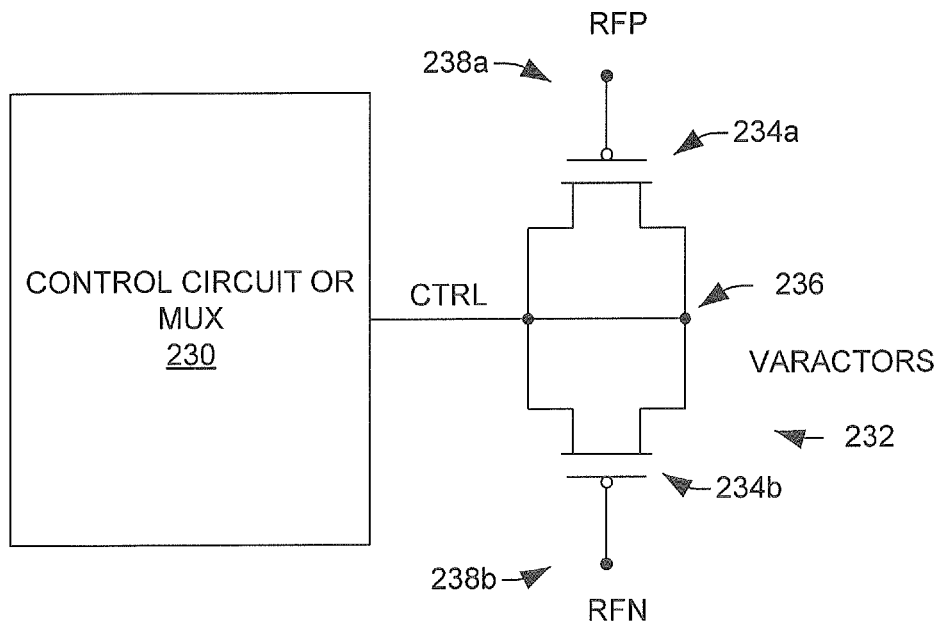

FIG. 2B is a circuit diagram illustrating another digital controlled oscillator (DCO) 204 in accordance with an embodiment of the invention. The DCO 204 is shown in FIG. 2B for illustrative purposes and other variations and implementations are contemplated in accordance with the invention. The DCO 204 of FIG. 2B is similar to that of FIG. 2A, but additionally includes an AC coupling network 240.

An output signal or clock is provided at the outputs QP and QN. An input signal or reference is provided/generated at 202. The DCO 204 includes a varactor array 205 for fine tuning and a coarse tuning component 206 for course tuning. The varactor array 205 comprises a split varactor array, such as the array 406 shown and described below and in FIG. 4. Here, the varactor array 205 is not directly connected to the DCO outputs QP and QN. Instead, an AC coupling network 240 couples the varactor array 205 outputs RFP and RFN to the DCO outputs QP and QN. The The coarse tuning component 206 comprises a capacitor arrangement with switches. FIG. 2C provides an example arrangement of a coarse tuning component 206.

The DCO 204 generates the output clock according to control signals, also referred to as a control word. The control signals here are shown with a fine tuning component FT<K:0> and a coarse tuning component CT<N:0>. The CT component provides tuning for large or coarse frequency adjustments and the FT component provides tuning for small or fine frequency adjustments.

FIG. 2C is a circuit diagram illustrating a course tuning component 206 in accordance with an embodiment of the invention. The component 206 provides coarse or large frequency adjustments.

The coarse tuning component 206 comprises outputs 210 (QP and QN), a pair of capacitors 212$a$, 212$b$, a pair of resistors 214$a$, 214$b$, an NMOS transistor 216, inverters 218$a$, 218$b$, and a coarse control input 220.

The input 220 is connected to a second inverter 218$b$. An output of the second inverter 218$b$ is connected to an input of a first inverter 218$a$ and resistors 214$a$, 214$b$. The first inverter 218$a$ is connected to the transistor 216. The resistor 214$a$ is connected to a first capacitor 212$a$ and the transistor 216. The resistor 214$b$ is connected to a second capacitor 212$b$ and the transistor 216. The outputs 210 are connected to the capacitors 212$a$ and 212$b$.

FIG. 2D is a circuit diagram illustrating a varactor cell 232 implemented using CMOS technology suitable for use with the present invention. The varactor cell 232 is provided as an example and it is appreciated that other types of varactor and/or capacitor devices can be employed with the present invention.

The varactor cell comprises a first PMOS device 234a and a second PMOS device 234b. Gates of the PMOS devices 234a, 234b yield the output capacitance 238a, 238b, which are provided at varactor nodes RFP and RFN. The varactor nodes RFP and RFN are connected to DCO nodes, such as nodes QP And QN of FIGS. 2A and 2B. The varactor nodes can be connected directly or via some coupling network to the DCO nodes QP and QN The output capacitance varies between first and second values according to first and second states (i.e., "on" and "off") of a control signal CTRL received at source and drain regions 236 of the PMOS devices 234a, 234b. The off state can correspond to a capacitance value of about or near zero. The on state corresponds to a capacitance value of a selected amount that is greater than the capacitance value of the off state. It is noted that the varactors can also be implemented using NMOS devices.

The control signal is generated or provided by control circuitry 230. In one example, the control circuitry 230 comprises a mux. The control circuitry can be implemented in CMOS technology using NMOS and PMOS devices. The control signal indicates whether the output capacitance should correspond to the first or second state.

Figure 3A:
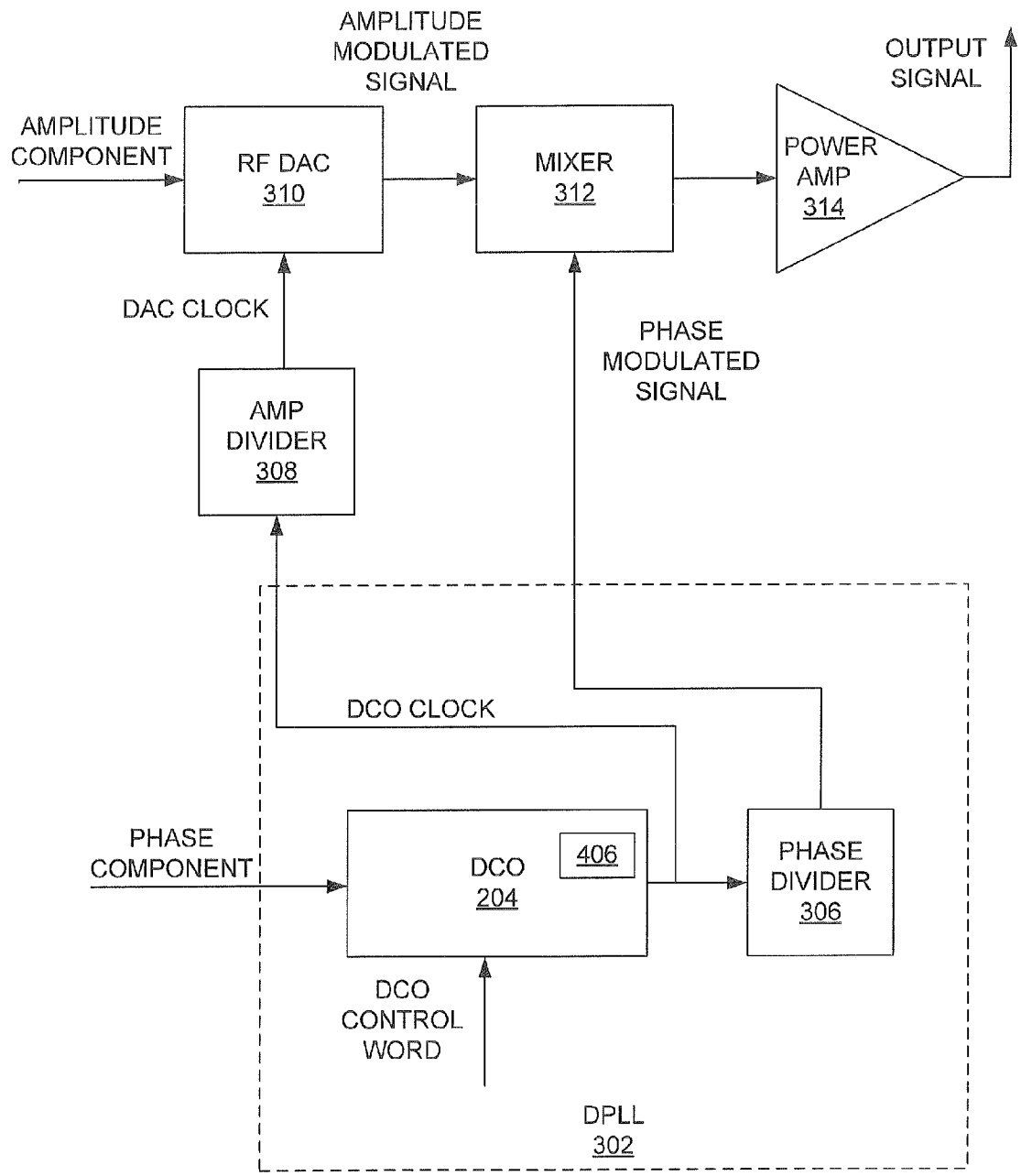
FIG. 3A is a block diagram illustrating a digital polar transmitter circuit in accordance with an embodiment of the invention.

FIG. 3A is a simplified block diagram illustrating a digital polar transmitter circuit in accordance with an embodiment of the invention. It is appreciated that all of the units and/or components of the transmitter are not shown for illustrative purposes. The transmitter circuit 300 includes a digital phase lock loop (DPLL) 302, a digital controlled oscillator (DCO) 304, a phase divider 306, an amplitude divider 308, a radio frequency (RF) digital to analog converter (DAC) 310, a mixer 312, and a power amplifier (PA) 314.

A phase component or phase modulation data is received by the DPLL 302. An amplitude component or amplitude modulation data is received by the RF DAC 310. The phase component and the amplitude component have been converted from base band modulation data.

The DPLL 302 includes the DCO 304 and the phase divider 306 and performs phase modulation in a phase domain. The DCO 204 generates an output clock, referred to as a DCO clock from the phase component and according to a received DCO control word. The DCO clock has a frequency determined by the composition of the DCO 204 and the DCO control word relative to a reference frequency. The reference frequency is typically higher than the frequency needed for transmission. For example, the reference frequency may be 2-4 times higher than the transmission frequency. Generally, the frequency of the DCO clock is selected or adjusted by a step size. A single frequency step size corresponds to a single unit of change by the DCO control word.

The DCO control word is comprised of a defined number of bits, wherein each bit corresponds to a single unit of change, the frequency step size. The frequency of the output clock is related to a set or established reference frequency by the control word. The number of integer bits used is implementation dependent. In one example, the control word is a step size variation from a prior control word.

The DCO clock is received by the phase divider 306, which divides the clock to generate an RF clock. In one example, the DCO clock operates at twice the frequency of the RF clock. The amplitude divider 308 also receives the DCO clock and generates a divided clock, referred to as the DAC clock. The DAC clock is some division of the DCO clock and is used for amplitude modulation. In one example, the DAC clock is $1/7^{th}$ of the DCO clock frequency.

The RF DAC 310 performs amplitude modulation of the amplitude component according to the DAC clock. The amplitude modulated signal and the phase modulated signal are received and mixed at the mixer 312. The mixer 312 provides the mixed signal to the power amplifier 314, which generates the output signal.

The DCO 204 employs a split varactor array 406 with improved matching and a varactor switching/control scheme. The split varactor array 406 is comprised of switchable capacitance devices, such as varactors. The varactors are selectively switched into a high capacitance mode or a low capacitance mode according to a digital control signal. The varactor array 406 utilized with the DCO 204 reduces the number of discretely controlled varactors, permits simultaneous switching of varactors and provides separate between varactors and control logic. The varactors are arranged in cells of uniform size and cells of varied, incremental capacitance values or varactor sizes, as described infra. An example of suitable CMOS varactors is shown in FIG. 2D.

The split varactor array 406 can operate in varied modes. In a first mode, referred to as a calibration mode, the array 406 is calibrated for process voltage temperature (PVT) variations. The calibration sets a nominal center frequency of the oscillator to be within an equivalent of the varactor size. In a second mode, referred to as operational mode, varactor cells of varied sizes are selectively turned on or off to yield a selected capacitance that corresponds to the selected frequency for the output clock. In one example, the varactor cells are all initially set to off and then lower order cells of the split varactor array 406 are cycled through before higher order cells are turned on. Further details of the varactor array 406 are shown infra.

FIG. 3B shows a table depicting design specification requirements for first and second generation Bluetooth DCOs. The specifications are compared in terms of tuning range Δf, frequency resolution without dithering $f_{RES}$, maximum modulation frequency step $(f_{STEP})$max, and DCO control word update clock frequency $f_{MOD}$.

The modulation type of Bluetooth V1.0 is GFSK with a symbol rate of 1 MBit/s, BT=0.5 and a modulation index in the range of 0.28-0.35 with a nominal value of 0.32 or a frequency deviation from the carrier frequency of f=±160 kHz. The gaussian pulse shaping filter which has a bandwidth of 0.5 MHz is clocked by the re-timed reference clock, CLKR, with an average frequency of $f_{REF}$=26 MHz. The DCO control word is updated synchronous to CLKR. The fine tuning array is therefore modulated relatively slowly and with every update of the DCO tuning word only a few varactors are switching.

The tuning range of the DCO for Bluetooth V2.0+EDR must be in the range of +/−25 MHz, due to the large required frequency step of the DCO (~22 MHz for a CORDIC frequency of 11 MHz) in case of a zero crossing in the constellation diagram.

The large maximum frequency step $(f_{STEP})_{max}$=22 MHz and the total tuning range Δf=50 MHz shows that almost half of the varactors in the varactor array can switch simultaneously during modulation. This, together with the approximately 7 times higher $f_{MOD}$ for Bluetooth V2.0+EDR compared to Bluetooth V1.0/V1.2 makes prior art array configurations, such as the one shown in FIG. 1, unsuitable. Bluetooth V1.0 only specifies GFSK modulation, so prior art DCOs can be suitable for such implementations. Bluetooth V2.0+EDR specifies more sophisticated modulation schemes, such as EDR.

Figures 3, 4:
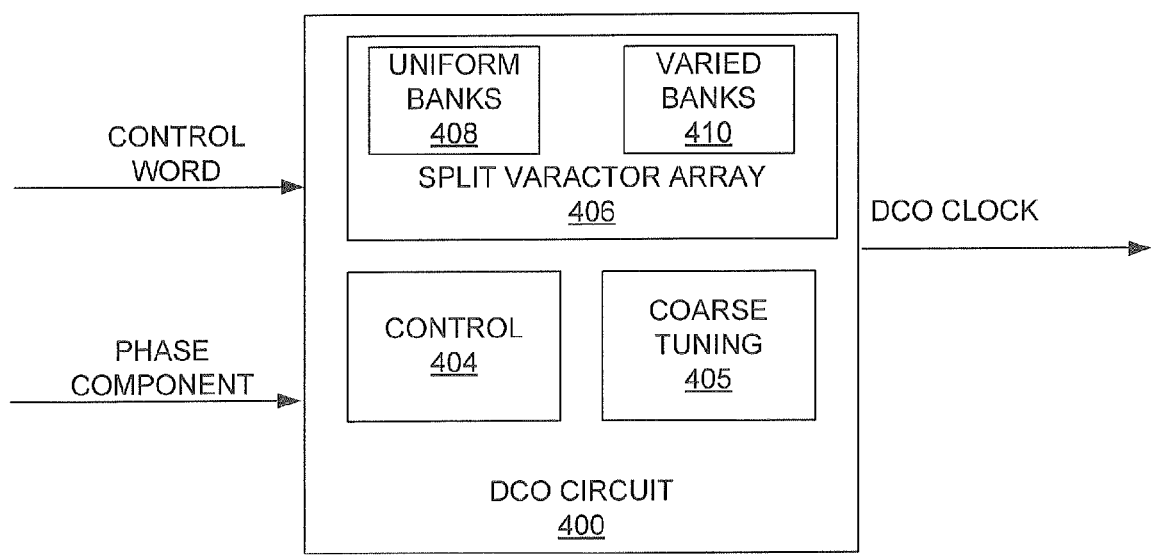
FIG. 4 is a block diagram illustrating a digital controlled oscillator in accordance with an embodiment of the invention.

FIG. 4 is a block diagram of a DCO 400 in accordance with an embodiment of the invention. The DCO 400 can be employed with the system 200 of FIG. 2. The DCO 400 utilizes a split varactor array 406 with improved matching and a varactor switching/control scheme. The varactor array reduces the number of discretely controlled varactors, permits simultaneous switching of varactors and provides separate between varactors and control logic.

The DCO 400 includes control logic 404 and the split varactor array 406. The DCO receives a phase component of a base band signal and a control word and provides a DCO clock. The DCO clock is a digital variable clock signal in the RF frequency band. The frequency of the DCO clock is adjustable to a variable frequency by the control word, also referred to as a command word, and frequency command word. The control word is time variant and the number of bits used for the control word is dependent upon the frequency step size and varactor unit size of the varactor banks.

The control logic 404 controls the operation of the DCO 400. The control logic 404 includes control lines that select portions of the varactor banks 406 and control states of the varactors within the banks as described below.

The varactor banks 406 include one or more uniform banks 408 having uniformly sized varactor cells. Each cell comprises a plurality of individual varactors or capacitance devices, typically connected in parallel and have substantially equal capacitance values for both logical states, on and off. In one example, the uniform banks 408 are referred to as most significant bits (MSB) banks. In one example, the size of the plurality of varactors connected in parallel is fixed, such as 8.

The varactor banks 406 also include an incrementally varied bank 410 having incrementally varied sized, in terms of capacitance values, varactor cells. In one example, the varied bank 410 is referred to as a least significant bits (LSB) bank 410. The varied bank 410 includes varactor cells comprised of varied sizes. In one example, the varied bank 410 includes varactor cells having sizes ranging from one or unity to one less than the size of the plurality of varactors in the uniform banks 408. The "one or unity" refers to a base capacitance or varactor value and may refer to a single varactor or capacitance device. The cells again comprise one or more varactors connected in parallel. In one example, the varied bank includes cells ranging from sizes of one to seven. In one example, the cells within the varied bank are 1-hot encoded so only one cell is active at a time.

The active cells of the varactor banks 406 operate as a single unit. When a cell is turned "on", the varactors within the cell are turned "on" and the capacitance value for the cell is changed to correspond to the "on" state. When a cell is turned off, the varactors within the cell are turned off and the capacitance value for the cell is changed to correspond to the "off" state.

The required number of varactor array bits NB can be calculated from the selected or desired frequency resolution. For example, a frequency resolution $f_{RES}$=75.0 kHz and the tuning range $\Delta f=\pm 25$ MHz:

$$NB = \left\lceil log_2\left(\frac{\Delta f}{f_{RES}}\right)\right\rceil$$
$$= 10$$

In a prior art fully thermometer coded varactor array the number of discretely controlled varactor unit cells $N_{VAR}$ would be:

$$N_{VAR}=2^{NB}=1024$$

Thus, a prior art implementation would require 1024 discretely controlled varactors with complex control logic including 1024 control lines.

Due to the high DCO control word update frequency $f_{MOD}$ in the range of 175 MHz the new varactor array structure should fulfill the following requirements:

An example varactor configuration in accordance with the present invention is shown in FIG. 5. This configuration meets the DCO requirements for Bluetooth 2.0 including the above specified frequency resolution and tuning range.

Here, 63 varactor cells are used in the uniform bank 408 and 7 varactor cells are used in the varied bank 410. The uniform bank cells are addressed with 6 bits and have a size of 8. Each uniform bank cell includes 8 equally sized or unit sized varactors connected in parallel. The varied bank cells are addressed with 3 bits and have sizes ranging from 1 to 7. An extra bank, LSB05, is also present in this example and is used for dithering purposes with a sigma delta modulator. The extra bank in this example is set to a varactor size of 0.5.

Figure 6A:
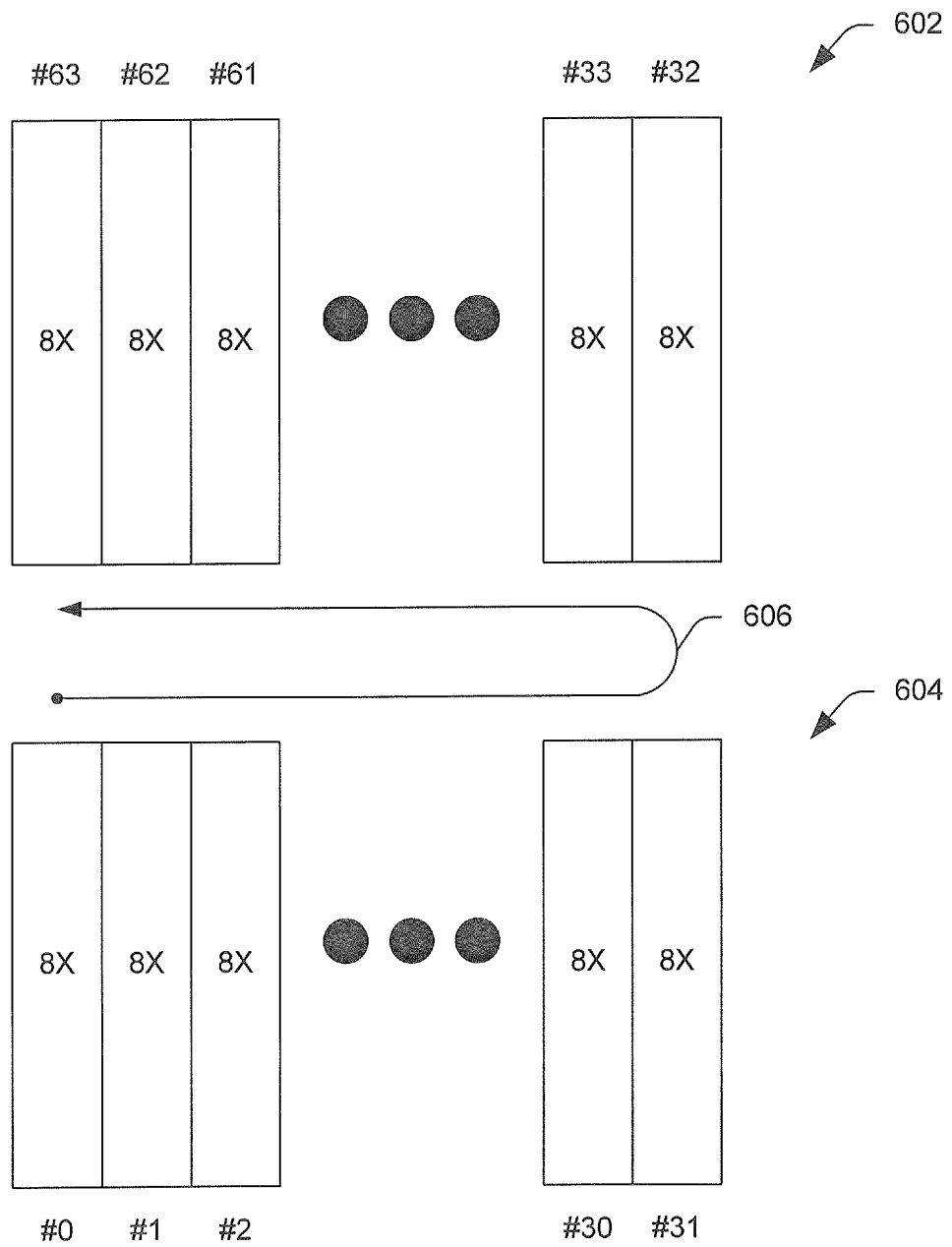
FIG. 6A is a block diagram depicting a varactor bank having equal sized varactor cells in accordance with an embodiment of the invention.
Figure 6:
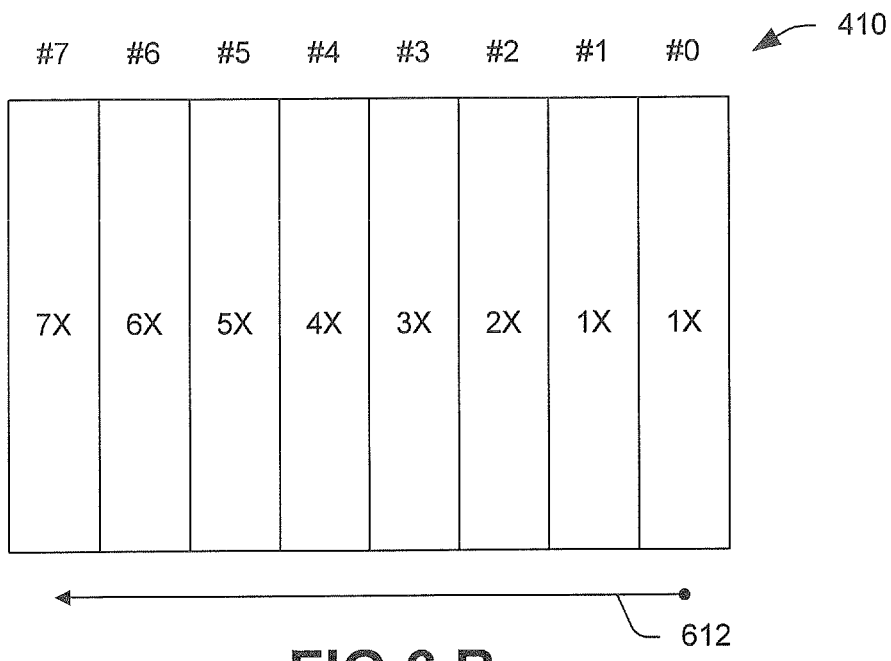
FIG. 6B is a block diagram depicting a varactor bank having incrementally sized varactor cells in accordance with an embodiment of the invention.
FIG. 6C is a block diagram depicting an extra varactor bank in accordance with an embodiment of the invention.
FIG. 6D is a block diagram depicting a control arrangement for a varactor bank having equal sized varactor cells in accordance with an embodiment of the invention.
FIG. 6E is a block diagram depicting a control arrangement or circuit for a varactor bank having incrementally sized varactor cells in accordance with an embodiment of the invention.
Figure 6C:
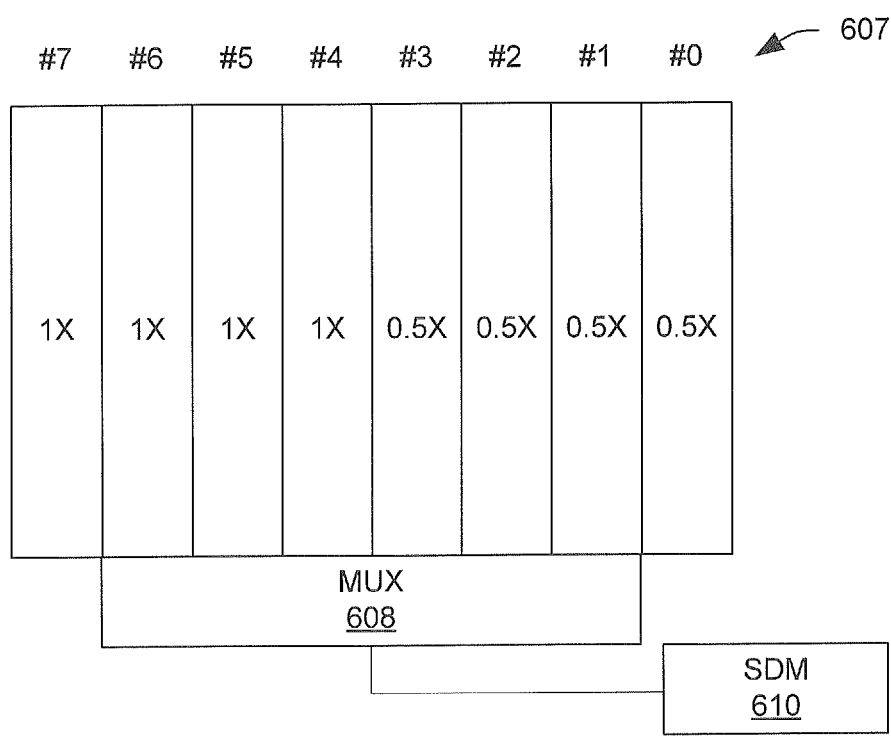
Figure 6:
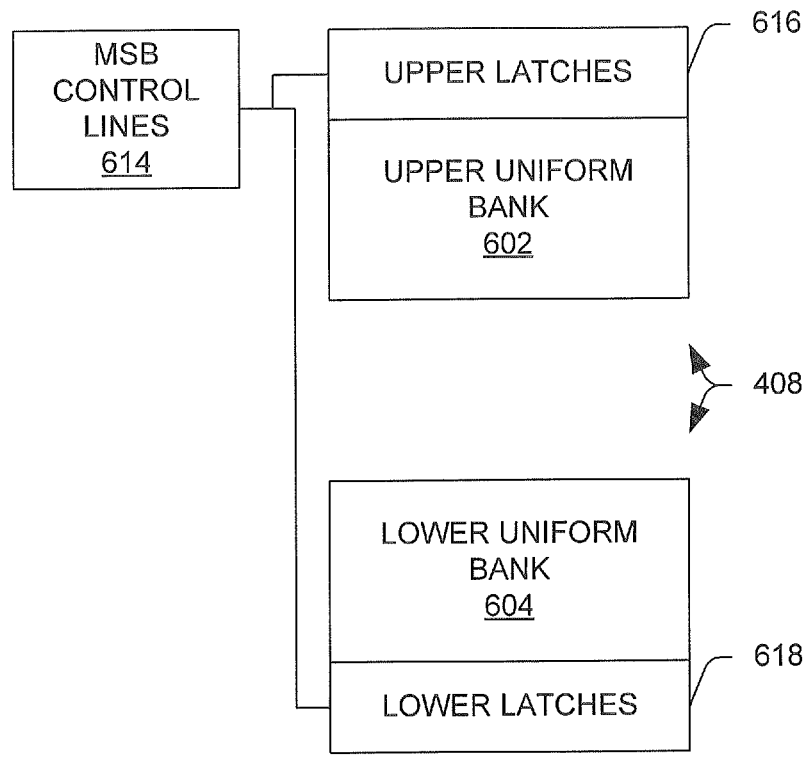

FIGS. 6A, 6B, and 6C depict varactor banks for use with a DCO in accordance with an embodiment of the invention. FIG. 6A is a block diagram depicting an MSB varactor bank 408 in accordance with an embodiment of the invention. The uniform bank 408 includes 63 8 size varactor cells. Each of the cells is implemented with eight substantially identical varactor devices connected in parallel. In one example, the varactor devices are PMOS devices, such as shown in FIG. 2D. In another example, the varactor devices are NMOS devices.

The uniform bank 408 is shown with an upper bank 602 and a lower bank 604. The upper bank 602 includes cells numbered from #32 to #63. The lower bank 604 includes cells numbered from #0 to #31. The individual cells are configured such that the active varactors within the cell are turned on or off. Thus, when a cell is turned on, the eight varactors within the cell are turned on. When a cell is turned off, the eight varactors within the cell are turned off.

In one example, the cells within the bank 408 are addressed in a meandering style addressing scheme 606 wherein each cell is addressed in sequence starting from cell #0.

It is appreciated that alternate embodiments of the invention include variations on sizes for the cells within the uniform bank 408.

FIG. 6B is a block diagram depicting an LSB varactor bank 410 in accordance with an embodiment of the invention. The varactor bank 410 includes 7 cells of increasing size from #1 to #7. Cell #1 is sized at 1 as shown in FIG. 6B and the remaining cells are incrementally higher in size until cell #7, which is sized at 7. An extra cell #0 is provided, but may not necessarily be used.

In one example, each cell comprises eight identical varactors, similar to the configuration utilized for the uniform bank 408. However, some of the varactors within the cells of the varied bank 410 are not connected, thus only one to seven of the varactors are actively connected and referred to as active devices. The unconnected devices can be referred to as dummy devices.

The cells within the varied bank 410 are configured such that only one cell is turned on at any given time. This type of activation is also referred to as one-hot encoding. In one example, a meandering activation scheme 612 is shown wherein the lowest cell, #0 or #1 is activated first, and then the next cell sizes in sequence until the last cell #7 is activated. In an alternate embodiment, more than one of the cells can be turned on.

FIG. 6C is a block diagram of an extra varactor bank 607 in accordance with an embodiment of the invention. In this embodiment, the extra bank 607 includes eight cells, four having a varactor size of 1 and the other four having a varactor size of 0.5. The cells are designated from #0 to #7. A multiplexer (MUX) 608 is connected to the cells and controls turning on the cells. A sigma delta modulator 610 and an additional control signal LSB_SEL 609 is connected to the multiplexer 608 and possibly also to the sigma delta modulator 610, to perform frequency controlled dithering via the multiplexer. The dithering facilitates frequency resolution enhancement. Additionally, the extra bank can be utilized to facilitate matching. It is appreciated that alternate embodiments can include varied numbers of cells and varactor sizes and control configuration or circuits.

FIG. 6D is a block diagram depicting a control arrangement for a uniform bank 408 in accordance with an embodiment of the invention. The control arrangement comprises MSB control lines 614, upper latches 616, lower latches 618, an upper uniform bank 602, and a lower uniform bank 604.

The uniform bank 408 comprises the upper uniform bank 602 and the lower uniform bank 604. It is appreciated that alternate embodiments of the invention can include alternative arrangements for the uniform bank 408. The uniform bank includes a specific number of cells having the same capacitance or varactor size. The capacitance can be specified as the specific number of cells multiplied by unity, which refers to a base capacitance value. In one example, the number of cells is 64 and the size is 8. In another example, each of the cells is implemented with eight identical devices connected in parallel where each device has a capacitance value of unity. In one example, the varactor devices are implemented using CMOS technology. The individual cells are configured such that the active varactors within the cell are turned on or off.

The upper latches 616 comprise a latch for each cell of the upper uniform bank 602. Thus, for example, if there are 32 cells in the upper uniform bank 602, there are 32 latches of the upper latches 616 associated with the 32 latches. Similarly, the lower latches 618 comprise a latch for each cell of the lower uniform bank 604. Thus, for example, if there are 32 cells in the lower uniform bank 604, there are 32 latches of the lower latches 618 associated with the 32 latches of the lower uniform bank 606.

The MSB control lines 614 are connected to the upper latches 616 and the lower latches 618. The latches 616 have first and second states and the MSB control lines 614 control the states of the latches 616 and, as a result, which cells are turned on or off. In one example, the MSB control lines 614 comprise six lines or bits of data. One line or bit of data selects between the upper latches 616 and the lower latches 618 and the remaining 5 select one of the lower latches 618 or the upper latches 616.

Figure 6E:
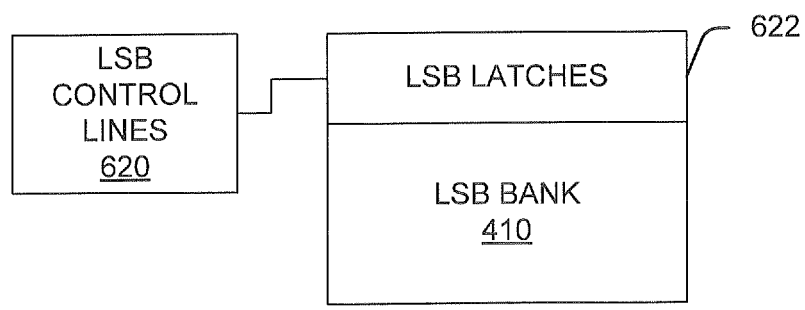

FIG. 6E is a block diagram depicting a control arrangement for an LSB varactor bank 410 in accordance with an embodiment of the invention. The control arrangement includes LSB control lines 620, LSB latches 622, and an varied bank 410. The varactor bank 410 includes a number of cells of varied incrementally sizes. In one example, a first cell starts at a varactor or capacitance size of 1, a second cell has a varactor or capacitance size of 2, and so on until a final number cell has a varactor or capacitance size of the final number. In another example, the LSB varactor bank includes 7 cells of increasing size from 1 to 7.

In one example, each cell comprises an identical number of varactors or capacitance devices, similar to the configuration utilized for the uniform bank 408. However, some of the varactors within the cells of the varied bank 410 are not connected. The unconnected devices can be referred to as dummy devices. Having similar configurations for each cell.

The cells within the varied bank 410 are configured such that only one cell is turned on at any given time. This type of activation is also referred to as one hot encoding. However, the unconnected devices, or dummy devices, are not turned on even when the cell is turned on because they are not connected.

The LSB latches 622 are connected to cells of the varied bank 410. Each cell of the varied bank 410 has a corresponding latch of the LSB latches 622 that controls it. The LSB latches 622 are controlled by the LSB control lines 620 to have one of the first and second states (i.e., "on" or "off"). In one example, the varied bank 410 includes 8 cells, the LSB latches 622 includes 8 latches, and there are 3 control lines or bits used for the LSB control lines 620.

Figure 7:
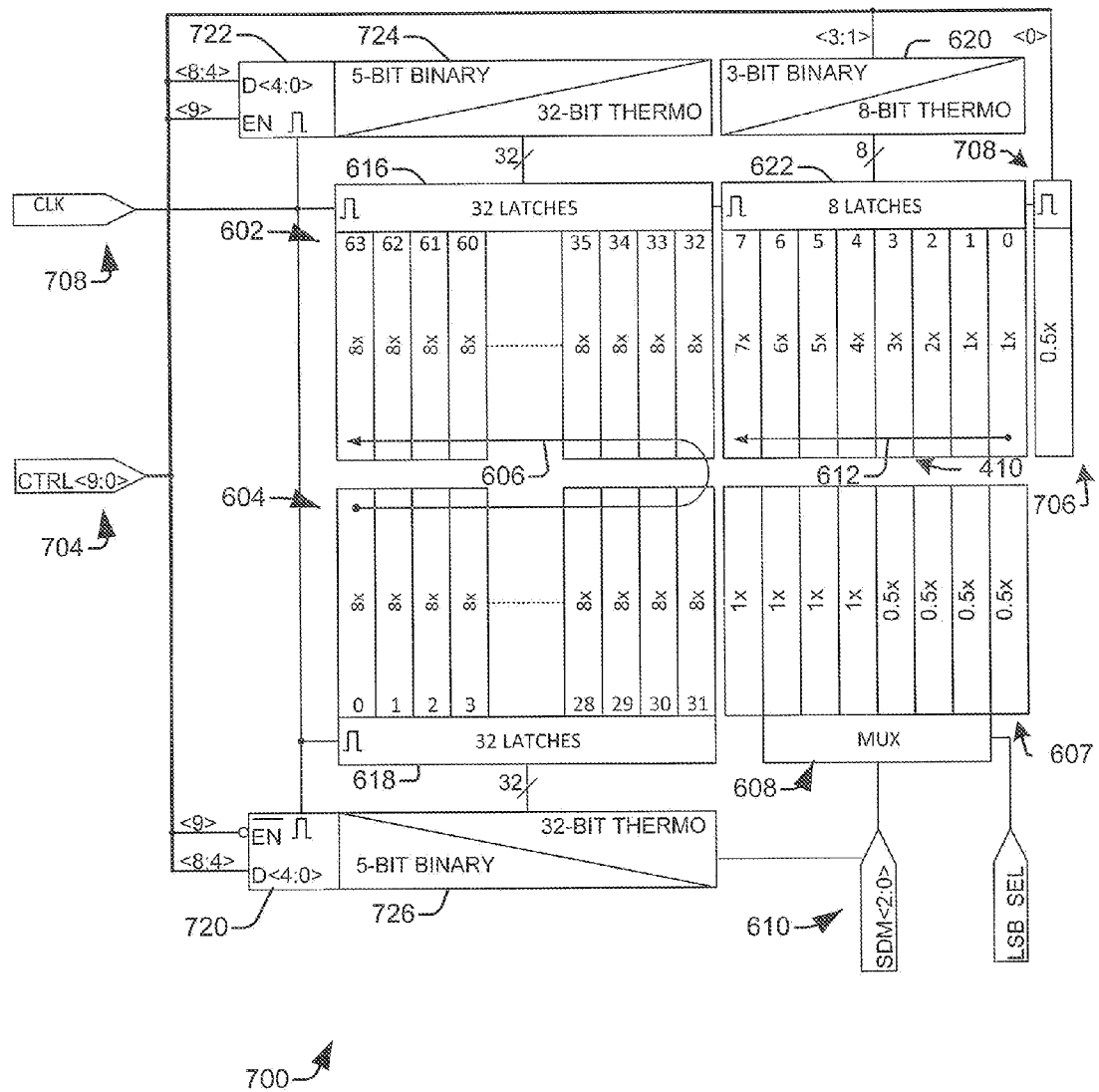
FIG. 7 is a diagram illustrating a split varactor array system in accordance with an embodiment of the invention.

FIG. 7 is a diagram illustrating a split varactor array system 700 in accordance with an embodiment of the invention. The system 700 is provided as an example implementation and it is appreciated that the present invention contemplates other suitable implementations. The system 700 yields a capacitance value according to a control signal or word 704 that can be utilized in a digital controlled oscillator system, such as the DCO 400 of FIG. 4 and the DCO 204 of FIG. 2A. Additionally, the system 700 can comprise at least part of a fine tuning portion of a digital controlled oscillator.

Uniform banks 602 and 604 comprise 64 varactor cells having a size of 8. Each varactor cell comprises a plurality of individual varactors or capacitance device, connected in parallel, and having substantially equal capacitance values for first and second logical states, on and off. When a cell is turned on, typically all the varactors or capacitance devices within cell are turned on, when a cell is turned off, typically all the varactors or capacitance devices within the cell are turned off. For example, in an on state, the varactor cells have a value of 8X, whereas in an off state, the varactor cells have a capacitance value of about 0. X is the value of a base varactor or capacitance device used in the system 700. In this example, the varactor cells comprise 8 capacitance devices connected in parallel.

The uniform banks comprise an upper bank 602 and a lower bank 604. The upper bank 602 includes 32 cells numbered from 32 to 63. The lower bank 604 includes cells numbered from 0 to 31. The varactor cells of the upper bank 602 are controlled by upper latches 616, which include 32 latches, one for each of the cells of the upper bank 602. The upper latches 616 operate on a clock signal CLK 708 according to a 32 bit thermo coded signal. Alternatively, the upper latches 616 can be transparent instead of operating on a clock. Additionally, the upper latches 616 are controlled by an upper control circuit 724, which receives a 5 bit binary control signal D<4:0> and provides the 32 bit thermo coded control signal for the upper latches 616. The 32 bit thermo coded control signal is generated from the received 5 bit binary control signal. An upper enable circuit 722 provides the 5 bit binary control signal to the upper control circuit 724. The upper enable circuit 722 receives an enable bit <9> and upper bits <8:4> from a control signal or control word CTRL <9:0>704 and provides the 5 bit binary control signal accordingly.

The varactor cells of the lower bank 604 are controlled by lower latches 618, which include 32 latches, one for each of the cells of the lower bank 604. The lower latches 618 are controlled by an lower control circuit 726, which receives a 5 bit binary control signal D<4:0> and provides a 32 bit, thermo coded control signal for the lower latches. The lower latches 618 operate on the clock signal CLK 708. Alternatively, the lower latches 618 can be transparent instead of operating on the clock signal. The 32 bit thermo coded control signal is generated from the received 5 bit binary control signal. A lower enable circuit 720 provides the 5 bit binary control signal to the lower control circuit 726. The lower enable circuit 720 receives a NOT enable bit <9> and lower bits <8:4> from a control signal or control word CTRL <9:0>704 and provides the 5 bit binary control signal accordingly. The enable bit <9> operates such that only one of the cells in the upper or lower banks 602, 604 can be accessed at one time.

The varactor cells of the upper and lower banks 602 and 604 are addressed in a meandering scheme 606 starting with cell #0 of the lower bank all the way through to cell #63 of the upper bank 602. The cells are addressed in a meandering scheme 606 where each cell can be turned on or off. Thus, a range of zero cells or up to 64 cells of the upper and lower banks 602 and 604 can be turned on. Addressing schemes other than a meandering scheme could be implemented.

A varied bank 410 of varactor cells includes 8 varactor cells, having varied capacitance values ranging from 1X to 7X, where X is the value of a base varactor or capacitance device used in the system 700. In one example, the varactor cells comprise 8 varactor or capacitance devices connected in parallel. To yield the varied values from 1X to 7X, varactor or capacitance devices are left unconnected. Theses devices are referred to as dummy devices.

In this example, cells #0 and #1 of the varied bank 410 have varactor values of 1×. Thus, 7 of the varactor or capacitance devices within the cell are configured as dummy devices. Cells #2-#7 are configured with sequentially increasing varactor values starting from 2X to 7X. Thus, one of the varactor or capacitance devices of cell #7 is configured as a dummy device. When a cell is turned on, typically all the active varactors or capacitance devices within cell, except for dummy devices, are turned on. When a cell is turned off, typically all the active varactors or capacitance devices within the cell, except for dummy devices, are turned off.

The cells of the varied bank 410 are addressed in meandering scheme 612 and are one hot encoded so that only one of the cells can be on at any time. The cells are controlled by varied bank latches 622, also referred to as LSB latches. The varied bank latches 622 are devices having first and second states corresponding to "on" and "off". They are configured such that there is one latch for each varactor cell within the varied bank 410. The varied bank latches 622 are controlled by a varied control circuit 620, which receives a 3 bit binary control signal D<3:1> and provides an 8 bit, thermo coded control signal for the varied latches 622. The varied bank latches 622 operate on the clock signal CLK 708 according to the 8 bit thermo coded control signal, which is generated from the received 3 bit binary control signal. Alternatively, the varied bank latches 622 can be transparent instead of operating on the clock signal.

A special bank 706 is also present in the system 700. The special bank 706 includes a single varactor cell having a varactor value of 0.5X, where in X is a base value for default varactor or capacitance devices utilized for the system 700. The varactor cell of bank 706 includes a varactor or capacitance device having a value of 0.5X. The cell is operated by an extra latch 708, which is controlled by bits <0> of the control signal 704.

An extra bank 607, also referred to as a sigma delta bank, is present in the system 700. The extra bank 607 is typically used for dithering according to a sigma delta modulator control signal 610. The dithering facilitates frequency resolution and can also be utilized to facilitate matching. The extra bank 607 comprises 8 varactor cells in this example, 4 of which have varactor values of 1X and another 4 have varactor values of 0.5X. The cells of the extra bank 607 are controlled by a multiplexor 608 that operates according to a sigma delta signal <2:0>610 and an LSB_SEL signal 609.

Figure 8:
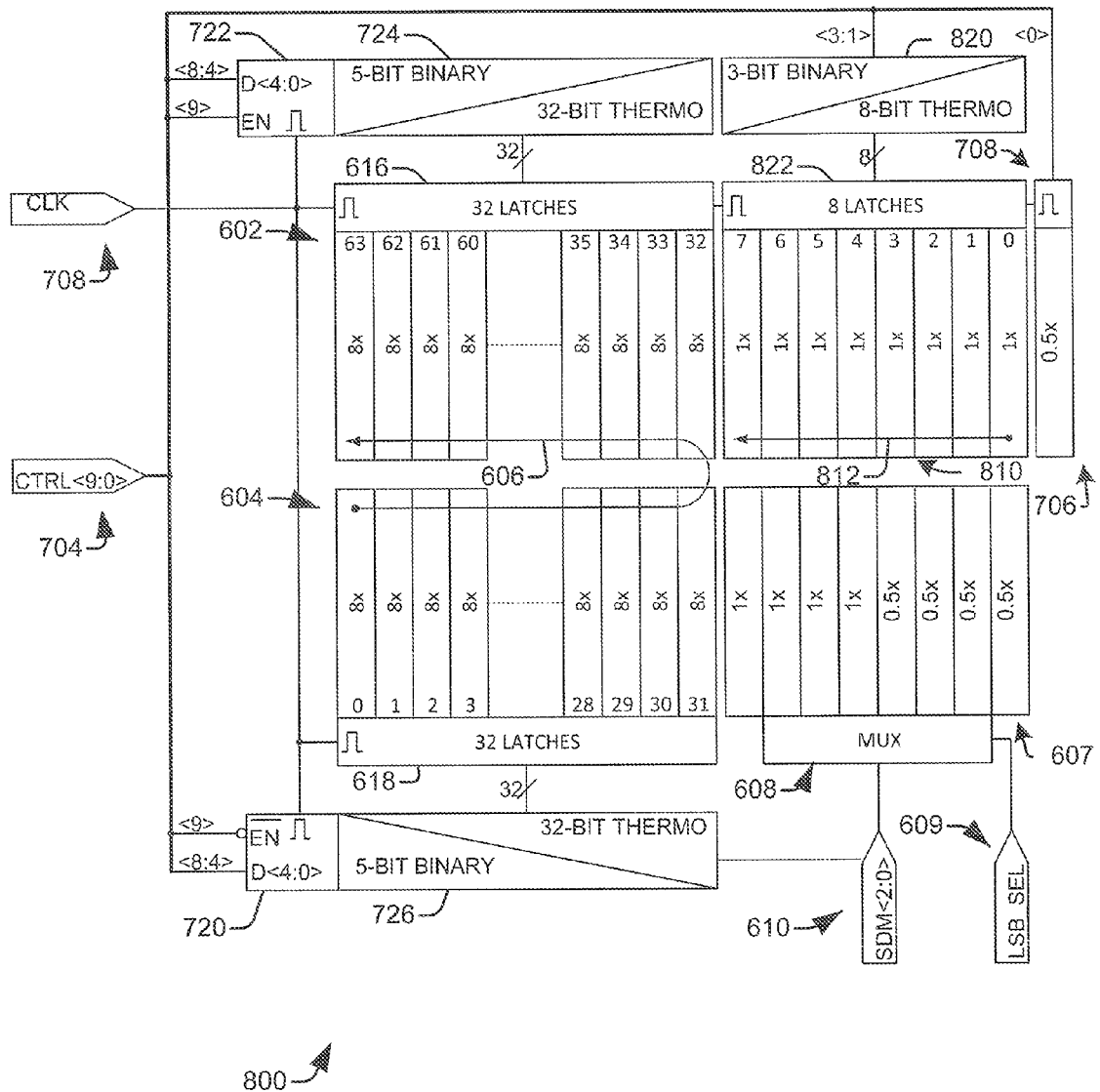
FIG. 8 is a diagram illustrating a split varactor array system in accordance with an embodiment of the invention.

FIG. 8 is a diagram illustrating a split varactor array system 800 in accordance with an embodiment of the invention. The system 800 is provided as an example implementation and it is appreciated that the present invention contemplates other suitable implementations. The system 800 yields a capacitance value according to a control signal or word 704 that can be utilized in a digital controlled oscillator system.

The system 800 is substantially similar to the system 700 of FIG. 4 and the description thereof, except that a single unit bank 810 is utilized instead of the varied bank 410. The single unit bank 810 is comprise of 8 varactor cells having the same varactor value, 1X in this example. The varactor cells each comprise a single active varactor or capacitance device and, in one example, have seven dummy devices that are not connected.

The cells of the unit bank 810 are not hot encoded so more than one cell can be turned on at once. Thus, to yield a capacitance or varactor value of 3X, cells #0, #1 and #2 can be turned on instead of a single cell have a value of 3X as with varied bank 410 of FIG. 7.

The cells are controlled by unit latches 822 and are configured such that there is one latch for each varactor cell within the unit bank 810. The unit latches 322 are controlled by a unit control circuit 820, which receives a 3 bit binary control signal D<3:1> and provides an 8 bit, thermo coded control signal for the latches 822. The unit latches 822 operate on the clock signal CLK 708 according to the 8 bit thermo coded control signal, which is generated from the received 3 bit binary control signal.

However, the system 800 can reduce the number of control lines needed when compared with prior art systems. However, the system 700, including the hot encoding and the varied bank 410 can mitigate differential non linearity better than the system 800.

Figure 9:
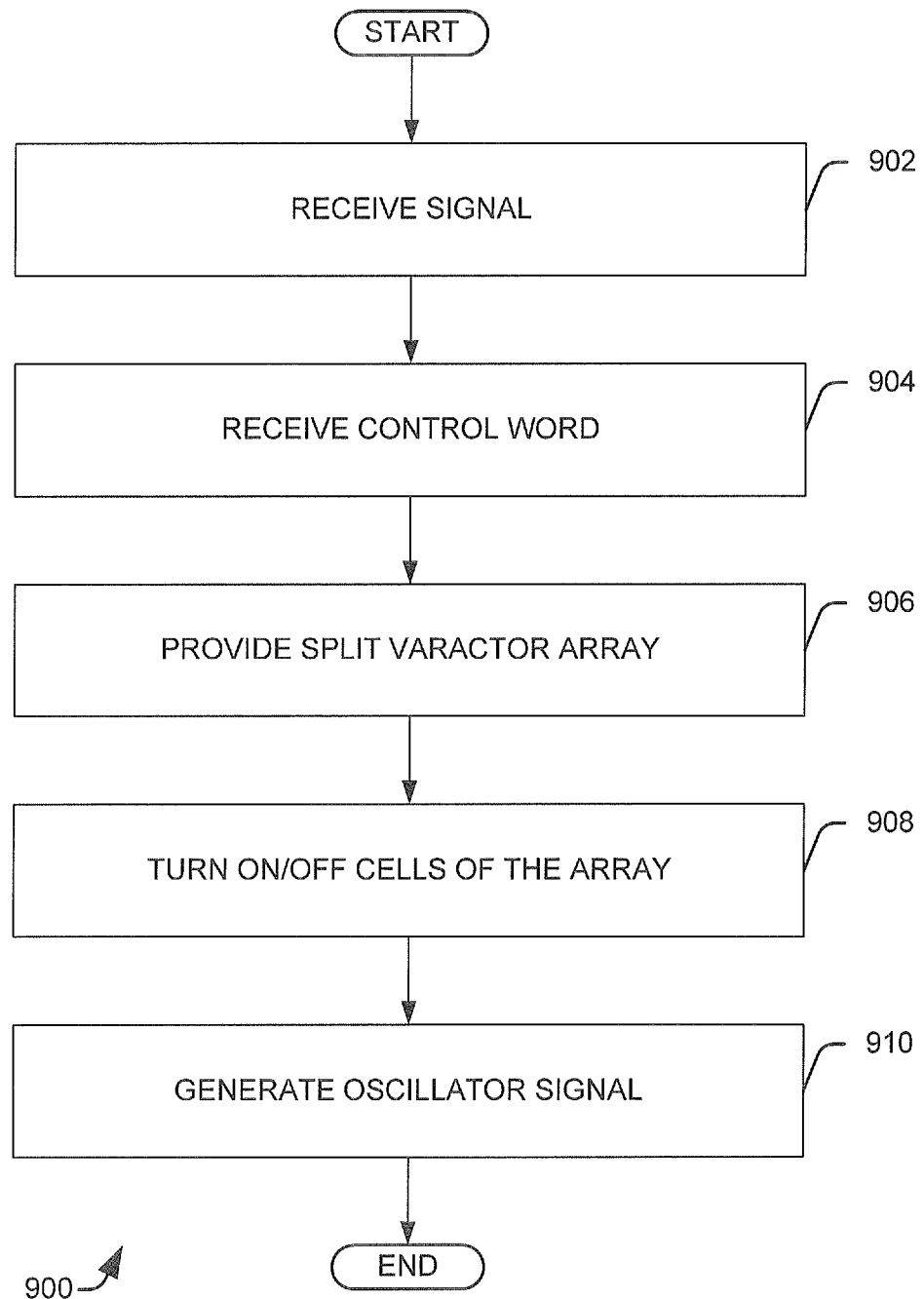
FIG. 9 is a flow diagram illustrating a method of generating an oscillator signal in accordance with an embodiment of the invention.

FIG. 9 is a flow diagram illustrating a method 900 of generating an oscillator signal in accordance with an embodiment of the invention. The method generates the oscillator signal at a selected frequency by utilizing a split varactor array. The method 900 turns on (or off) various sized varactor cells to adjust the output frequency of the oscillator signal. The method 900 can be utilized by communication systems and the like, such as a polar transmitter.

It is noted that the method 900 can be performed with the circuits and configurations shown and described above. Further, the method is shown in an illustrated order, however it is appreciated that the order can be altered and still be in accordance with the present invention. Furthermore, it is also appreciated that portions of the method 900 can be omitted and/or additional steps performed in alternate embodiments of the invention.

The method 900 begins at block 902, wherein a signal is received. The signal, in one example, is as a phase component of a baseband signal. A control word is received at block 904. The control word is a time varying value that corresponds to a time varying selected frequency. The time varying selected frequency can vary by a value referred to as a step size. The step size also corresponds to a smallest bit change of the control word.

The split varactor array is provided at block 906. The split varactor array includes a first array having incremental, thermometer cell sizes and a second array having fixed and uniform cell sizes. The incremental cell sizes range from a single unit value to a specified number or max size. The first array includes cells, incrementally, from one to the specified number or max size. In one example, the first array includes seven varactor cells ranging from a size of one to a size of seven. The second array comprises cells having a fixed, uniform varactor size. In one example, the cells have a uniform varactor size of eight.

One or more cells of the split varactor array are turned on (or off) at block 908. The control word identifies the selected frequency and corresponds to a capacitance value to be yielded by the split varactor array. The higher the capacitance, the lower the frequency of the generated oscillator signal. The number of varactors needed to be turned on and/or off is determined from the capacitance value. Additionally, it is determined which cell from the first array of incremental sizes and which cells from the second array of uniform sizes should be activated/on and which cells should be off. Then, the determined or identified cells of the split varactor array are turned on or off.

In one example, it is determined that a varactor size of 11 is needed. A first cell of size three from the first array is turned on, the rest off, and a first cell of size eight from the second array is turned on, the rest off. As a result, the varactor size of 11 and the associated capacitance is provided.

In an alternate method, the first array comprises cells of unitary sizes and the method may determine that multiple cells of the first array need to be turned on. For example, if a varactor size of 11 is needed, three cells of size one and a cell of size eight can be turned on to yield the selected varactor size.

An oscillator signal is generated from the received signal at the selected frequency using the capacitance value at block 910. The method 900 can be repeated over time as needed to perform additional adjustments.

It is noted that the claimed subject matter may be implemented as a method, apparatus, or article of manufacture using standard programming and/or engineering techniques to produce software, firmware, hardware, or any combination thereof to control a computer to implement the disclosed subject matter (e.g., the circuits and diagrams shown in FIGS. 2-8, etc., are non-limiting examples of circuits that may be used to implement method 900). Of course, those skilled in the art will recognize many modifications may be made to this configuration without departing from the scope or spirit of the claimed subject matter.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A digital controlled oscillator, comprising:
    an oscillator circuit configured to receive a control word and configured to generate an oscillator clock signal at a frequency selected by the control word;
    a varactor array having a first array of varactor cells having incremental capacitance values starting from a base capacitance value, wherein the incremental capacitance values are sequential integer multiples of the base capacitance value, wherein each of the varactor cells of the first array include an identical number of capacitors, each capacitor having a capacitance of the base capacitance value and at least a portion of the varactor cells configured to have one or more of its capacitors unconnected as dummy capacitors; and
    a control circuit coupled to the oscillator circuit configured to control the varactor array according to the control word.

2. The oscillator of claim 1, wherein the varactor array further comprises a second array of equal capacitance values.

3. The oscillator of claim 1, further comprising a coupling network to couple an output of the varactor array to an output of the oscillator circuit.

4. The oscillator of claim 1, wherein the control word is time varying digital information.

5. The oscillator of claim 1, wherein the oscillator clock signal is configured to have a specified step size.

6. The oscillator of claim 5, wherein a lowest bit of the control word corresponds to the specified step size.

7. The oscillator of claim 1, wherein the first array comprises a number of cells ranging from one to a selected number, and wherein the size of each cell ranges from unity to unity multiplied by the selected number.

8. The oscillator of claim 7, wherein the varactor array further comprises a second array having a plurality of varactor cells, wherein the size of each of the plurality of varactor cells is the sum of the selected number and one multiplied by unity.

9. The oscillator of claim 8, wherein the second array is configured with a top bank and a bottom bank.

10. The oscillator of claim 8, wherein the varactor array further comprises a third array.

11. The oscillator of claim 10, wherein the third array has a varactor cell having a size less than unity.

12. The oscillator of claim 10, wherein the third array has varactor cell sizes greater than the selected number multiplied by unity.

13. A phase locked loop circuit comprising:
    a digital controlled oscillator configured to receive a phase component and a control word and to generate an oscillator clock signal at a frequency selected by the control word, the digital controlled oscillator comprising;
        a varactor array having a first array of varactor cells with incremental capacitance values, wherein only one of the varactor cells can be on at any time and each cell includes a plurality of capacitors, wherein each of the varactor cells of the varactor array include an identical number of capacitors, each capacitor having a capacitance of the base capacitance value and at least a portion of the varactor cells configured to have one or more of its capacitors unconnected as dummy capacitors; and
        a control circuit coupled to the oscillator circuit configured to control the varactor array according to the control word; and
    a phase divider configured to divide the oscillator clock into a phase modulated signal.

14. The circuit of claim 13 wherein the control word of the digitally controlled oscillator is provided for modulation.

15. The circuit of claim 13 wherein each bit of the control word corresponds to a frequency step size.

16. The circuit of claim 15 where the frequency step size of the digitally controlled oscillator is a step size variation from a prior control word.

17. The circuit of claim 13 where the digital controlled oscillator further comprises a coarse tuning component coupled to the controller and having a capacitor arrangement.

18. The circuit of claim 13, wherein the varactor array further comprises a second array of equal capacitance values.

19. A method of generating an oscillator clock signal, the method comprising:
   receiving a signal;
   receiving a control word designating a selected frequency;
   providing a varactor array having a first array of varactor cells of incremental capacitance values starting from a base capacitance value and a second array of varactor cells of equal capacitance values, wherein the incremental capacitance values are sequential integer multiples of the base capacitance value, and wherein each of the varactor cells of the first array include an identical number of capacitors, each capacitor having a capacitance of the base capacitance value and at least a portion of the varactor cells of the first array configured to have one or more of its capacitors unconnected as dummy capacitors;
   turning on one or more cells of the varactor array to yield a capacitance value according to the selected frequency; and
   generating an oscillator clock signal from the received signal at the selected frequency using the capacitance value.

20. The method of claim 19, further comprising receiving a second control word designating a step size decrease in frequency and turning off a first cell of the varactor array and turning on a second cell of the varactor array to yield a second capacitance value according to the step size decrease in frequency.

21. The oscillator of claim 1, wherein at least a portion of the varactor cells include dummy capacitors and active capacitors, wherein the dummy capacitors are present within the cell and are not turned ON when the cells are turned ON.

* * * * *